(12) United States Patent
Shirota et al.

(10) Patent No.: US 7,120,216 B2
(45) Date of Patent: Oct. 10, 2006

(54) DATA/CLOCK RECOVERY CIRCUIT FOR RECOVERING DATA AND CLOCK SIGNAL WITH HIGH ACCURACY

(75) Inventors: Hiroshi Shirota, Tokyo (JP); Ryosuke Okuda, Tokyo (JP); Katsuya Mizumoto, Tokyo (JP); Kazuaki Tanida, Hyogo (JP)

(73) Assignees: Renesas Technology Corp., Tokyo (JP); Mitsubishi Electric System LSI Design Corporation, Itami (JP)

( * ) Notice: Subject to any disclaimer, the term of this patent is extended or adjusted under 35 U.S.C. 154(b) by 781 days.

(21) Appl. No.: 10/193,064

(22) Filed: Jul. 12, 2002

(65) Prior Publication Data

US 2003/0142773 A1 Jul. 31, 2003

(30) Foreign Application Priority Data

Jan. 28, 2002 (JP) ............................. 2002-019051

(51) Int. Cl.
*H03D 3/24* (2006.01)
(52) U.S. Cl. ...................... 375/373; 375/326; 375/327; 375/360
(58) Field of Classification Search ................ 375/326, 375/373, 327, 360, 376; 713/501
See application file for complete search history.

(56) References Cited

U.S. PATENT DOCUMENTS 6,137,850 A * 10/2000 Miller ........................ 375/354

6,310,895 B1 * 10/2001 Lundh et al. ................ 370/503
6,751,745 B1 * 6/2004 Yoshimura et al. ......... 713/501
6,760,389 B1 * 7/2004 Mukherjee et al. ......... 375/326
2003/0102928 A1 * 6/2003 d'Haene et al. ............. 331/172

FOREIGN PATENT DOCUMENTS

JP 2000-357964 12/2000

OTHER PUBLICATIONS

Dao-Long Chen, "A Power and Area Efficient CMOS Clock/Data Recovery Circuit for High-Speed Serial Interfaces", IEEE Journal of Solid-State Circuits, vol. 31, No. 8, Aug. 1996, pp. 1170-1176.

* cited by examiner

*Primary Examiner*—Kevin Burd
*Assistant Examiner*—Ted M. Wang
(74) *Attorney, Agent, or Firm*—Buchanan Ingersoll & Rooney PC

(57) ABSTRACT

A data/clock recovery circuit can recover high-rate data using the data as a clock signal. It includes an edge detector, a clock selection signal generating circuit, a clock selection circuit and a synchronizing circuit. The edge detector generates edge position information using a receiver output as a clock signal. The clock selection signal generating circuit generates a clock selection signal in response to the edge position information using the receiver output as the clock signal. The clock selection circuit selects a recovered clock signal from a clock signal group in response to the clock selection signal. The synchronizing circuit synchronizes the receiver output using the recovered clock signal, and outputs it as a synchronized data signal.

5 Claims, 18 Drawing Sheets

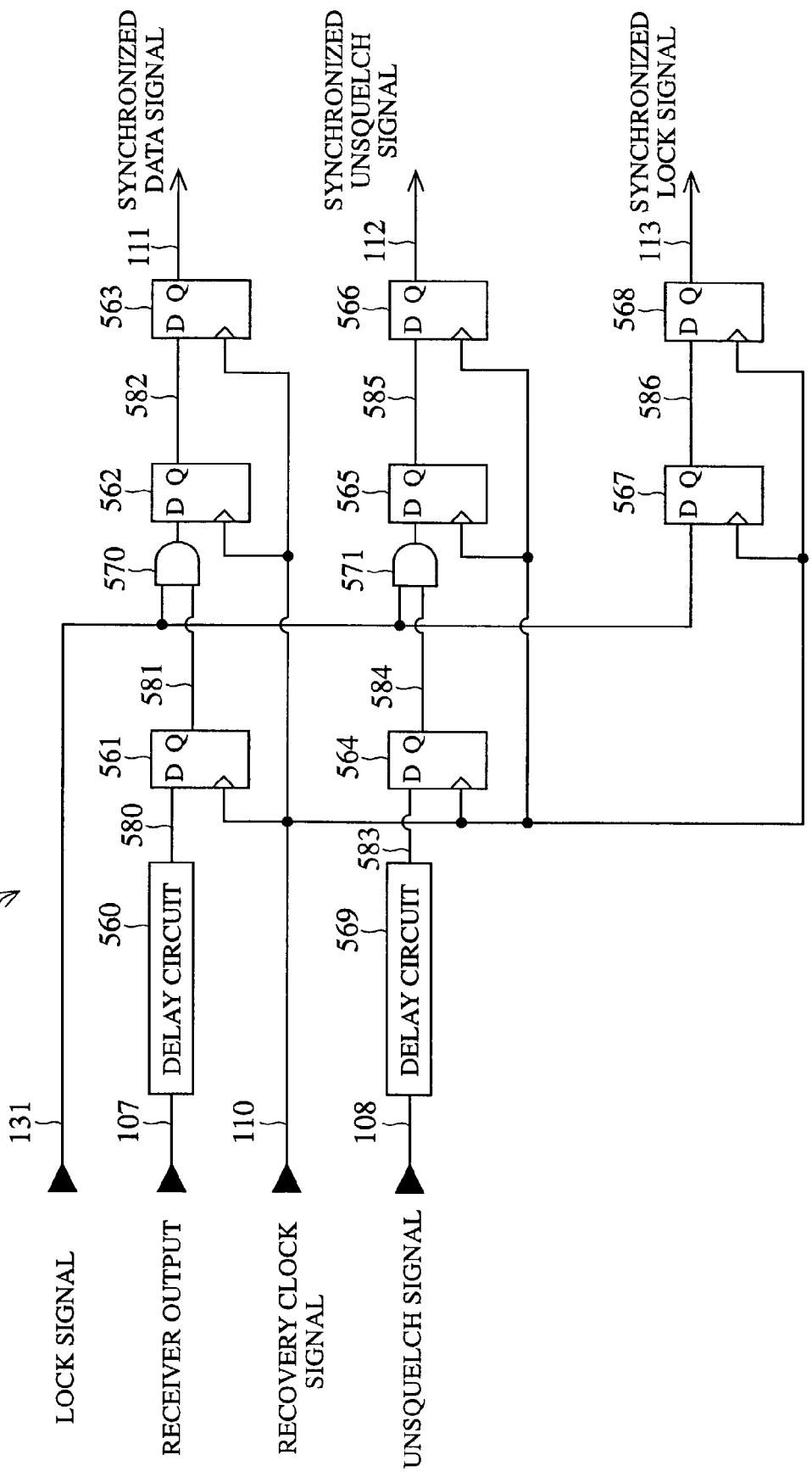

DATA/CLOCK RECOVERY CIRCUIT FOR RECOVERING DATA AND CLOCK SIGNAL WITH HIGH ACCURACY

BACKGROUND OF THE INVENTION

1. Field of the Invention

The present invention relates to a data/clock recovery circuit for recovering a high-rate clock signal and data with high accuracy in high-speed serial communication.

2. Description of Related Art

For example, the USB (Universal Serial Bus) 2.0 standard is a very high-speed serial communication standard with a communication rate of 480 MBPS (megabits per second).

Generally, a communication line consists of a total of four lines, a power supply line, a ground line and a pair of data lines (D+, D−). Thus, a clock signal is not fed through the communication line.

Thus, it is necessary for the serial transmission without the clock signal supplied to recover the clock signal from the received data fed from the data line, and to sample the received data using the clock signal recovered. A circuit for recovering the clock signal and data from the received data is called a data/clock recovery circuit.

As a conventional example of the data/clock recovery circuit, the following document is known.

Dao-Long Chen, "A Power and Area Efficient CMOS Clock/Data Recovery Circuit for High-Speed Serial Interfaces", IEEE JOURNAL OF SOLID-STATE CIRCUITS, VOL.31, NO.8 AUGUST 1996.

With the foregoing configuration, the conventional data/clock recovery circuit has the following problem. Since the jitter components on the data line are very large such as 0.4 UI (Unit Interval) and the transmission rate is very high such as 480 MBPS in the USB 2.0 standard, it is difficult to apply the conventional data/clock recovery circuit.

SUMMARY OF THE INVENTION

The present invention is implemented to solve the foregoing problem. It is therefore an object of the present invention to provide a data/clock recovery circuit capable of recovering very high-rate data by using the data as the clock signal.

According to one aspect of the present invention, there is provided a data/clock recovery circuit including: an edge detector for generating edge position information by using a receiver output as a clock signal, and by comparing phases of a plurality of clock signals constituting a clock signal group with a phase of an edge of the receiver output; a clock selection signal generating circuit for generating, using the receiver output as a clock signal, a clock selection signal in response to the edge position information; a clock selection circuit for selecting a clock signal from the clock signal group in response to the clock selection signal, and for outputting a selected clock signal as a recovered clock signal; and a synchronizing circuit for synchronizing the receiver output using the recovered clock signal, and for outputting the synchronized receiver output as a synchronized data signal. The edge detector and clock selection signal generating circuit do not use as a clock signal a high-rate clock signal such as the clock signals of the clock signal group and recovered clock signal, but uses a low-rate clock signal such as the receiver output as the input data. Accordingly, it is easy to implement a high-speed circuit in its entirety, and to restore the high rate data. In addition, since it selects the recovered clock signal from the clock signal group, its configuration can be simplified.

BRIEF DESCRIPTION OF THE DRAWINGS

FIG. 19 is a block diagram showing a detailed configuration of a synchronizing circuit 124 of an embodiment 6 in accordance with the present invention.

DETAILED DESCRIPTION OF THE PREFERRED EMBODIMENTS

The invention will now be described with reference to the accompanying drawings.

Embodiment 1

Figure 1:
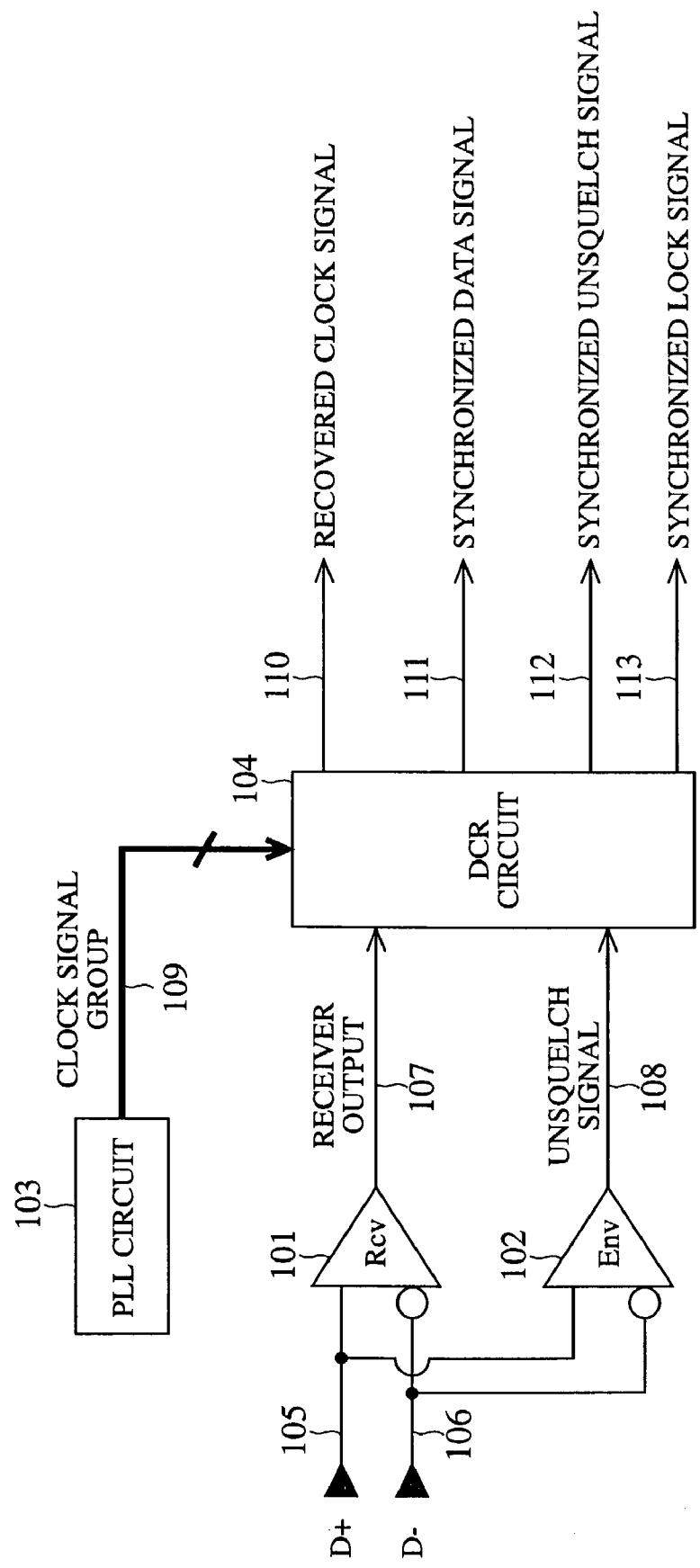
FIG. 1 is a block diagram showing a configuration of a USB-2.0 receiving circuit of an embodiment 1 in accordance with the present invention.

FIG. 1 is a block diagram showing a configuration of a USB-2.0 receiving circuit of an embodiment 1 in accordance with the present invention. In FIG. 1, the reference numeral 101 designates a differential receiver, 102 designates a transmission-envelope detector, 103 designates a PLL (Phase Locked Loop) circuit, and 104 designates a data/clock recovery (DCR) circuit.

Next, the operation of the present embodiment 1 will be described.

Figure 2:
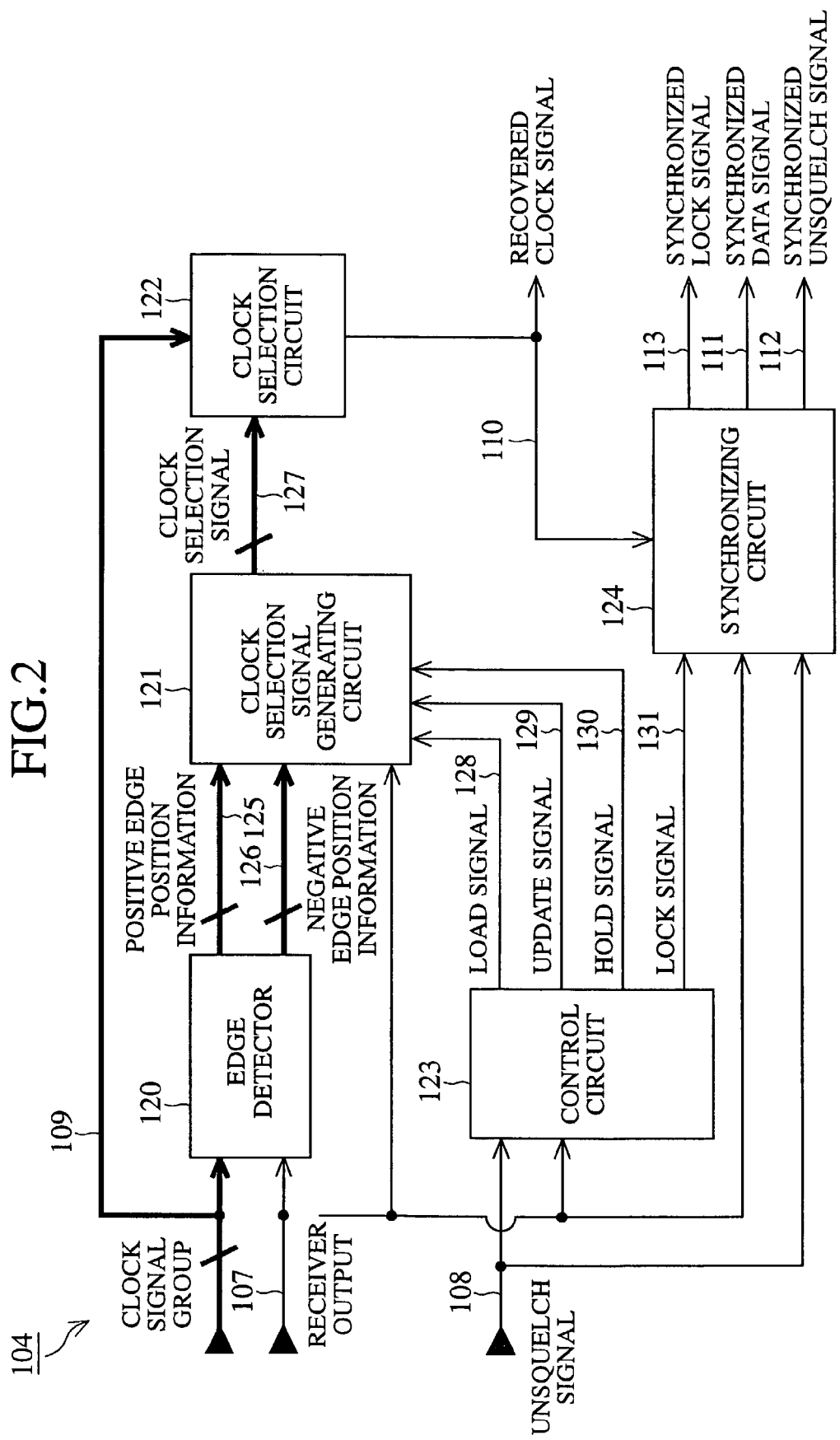
FIG. 2 is a block diagram showing a detailed configuration of a DCR circuit 104 of the embodiment 1 in accordance with the present invention.

The differential receiver 101, receiving a pair of differential signals D+ 105 and D− 106 from a USB cable, converts them into a single-end signal (receiver output 107) with a CMOS level. The transmission-envelope detector 102 detects whether the differential signals D+ 105 and D− 106 bear data, and asserts an unsquelch signal 108 when the differential potential between the signals D+ 105 and D− 106 exceeds a specified value. The PLL circuit 103 generates a clock signal group 109 consisting of a plurality of clock signals of 480 MHz with different phases. The DCR circuit 104 recovers a clock signal (recovered clock signal 110) and data (synchronized data signal 111) in response to the receiver output 107, unsquelch signal 108 and clock signal group 109. It also generates a synchronized unsquelch signal 112 and a synchronized lock signal 113. Comparing the phase of the receiver output 107 with the phases of the clock signals of the clock signal group 109 while the unsquelch signal 108 is asserted, the DCR circuit 104 selects from the clock signal group 109 the optimum clock signal for loading the receiver output 107, and adopts it as the recovered clock signal 110. The DCR circuit 104 synchronizes the receiver output 107 and unsquelch signal 108 with the recovered clock signal 110, and outputs them as a synchronized data signal 111 and synchronized unsquelch signal 112. In addition, the DCR circuit 104 generates the synchronized lock signal 113 indicating an enabling period of the recovered clock signal 110, synchronized data signal 111 and synchronized unsquelch signal 112 it generates FIG. 2 is a block diagram showing a detailed configuration of the DCR circuit 104 of the present embodiment 1 in accordance with the present invention. In FIG. 2, the reference numeral 120 designates an edge detector, 121 designates a clock selection signal generating circuit, 122 designates a clock selection circuit, 123 designates a control circuit and 124 designates a synchronizing circuit.

Next, the operation of the DCR circuit 104 will be described.

It is assumed in the following description that the transmission rate of the receiver output 107 is 480 MBPS, the frequency of the clock signals in the clock signal group 109 is 480 MHz, and the number of clock signals in the clock signal group 109 is 10 (the number of the clock signal taps is assumed to be 10). The application of the present invention, however, is not limited to the transmission rate of 480 MHz, nor to the 10 clock signal taps.

The edge detector 120 compares the phases of the 10 clock signals constituting the clock signal group 109 with the phases of the positive and negative edges of the receiver output 107. It generates a signal (positive edge position information 125) indicating the phase position of the positive edge of the receiver output 107, and a signal (negative edge position information 126) indicating the phase position of the negative edge of the receiver output 107. The positive edge position information 125 and the negative edge position information 126 are synchronized with the positive edge of the receiver output 107.

The clock selection signal generating circuit 121 calculates the optimum clock signal in the clock signal group 109 for synchronizing the receiver output 107 in accordance with the positive edge position information 125 and negative edge position information 126, and outputs a clock selection signal 127 that is synchronized with the receiver output 107 and designates the optimum clock signal. The clock selection signal generating circuit 121 has three operation modes, a load mode, an update mode and a hold mode, which are indicated by a load signal 128, an update signal 129 and a hold signal 130, respectively. In the load mode, the clock selection signal generating circuit 121 calculates the optimum clock signal (target clock signal) from only the positive edge position information 125 and negative edge position information 126 to establish synchronization with the receiver output 107, and outputs the target clock signal as the clock selection signal 127. The target clock signal, an optimum signal to sample the receiver output 107, is a clock signal with the phase most distant from the positive edge and negative edge of the receiver output 107. In the update mode, the clock selection signal generating circuit 121 calculates the next clock selection signal 127 from the current value of the clock selection signal 127 and that of the target clock signal. Comparing the current value of the current clock selection signal 127 with that of the target clock signal, the clock selection signal generating circuit 121 determines the value of the next clock selection signal 127 such that when the target clock signal leads in the phase, the next clock selection signal 127 designates the clock signal with one step phase lead. In other words, it decrements the value of the clock selection signal 127 by one step. In contrast, when the target clock signal lags in the phase, the next clock selection signal 127 designates the clock signal with one step phase lag. In other words, it increments the value of the clock selection signal 127 by one step. In the hold mode, the next clock selection signal 127 has the same value as the current clock selection signal 127 regardless of the value of the target clock signal.

The clock selection circuit 122 selects the clock signal designated by the clock selection signal 127 from the clock signal group 109, and outputs it as the recovered clock signal 110.

Figure 18:
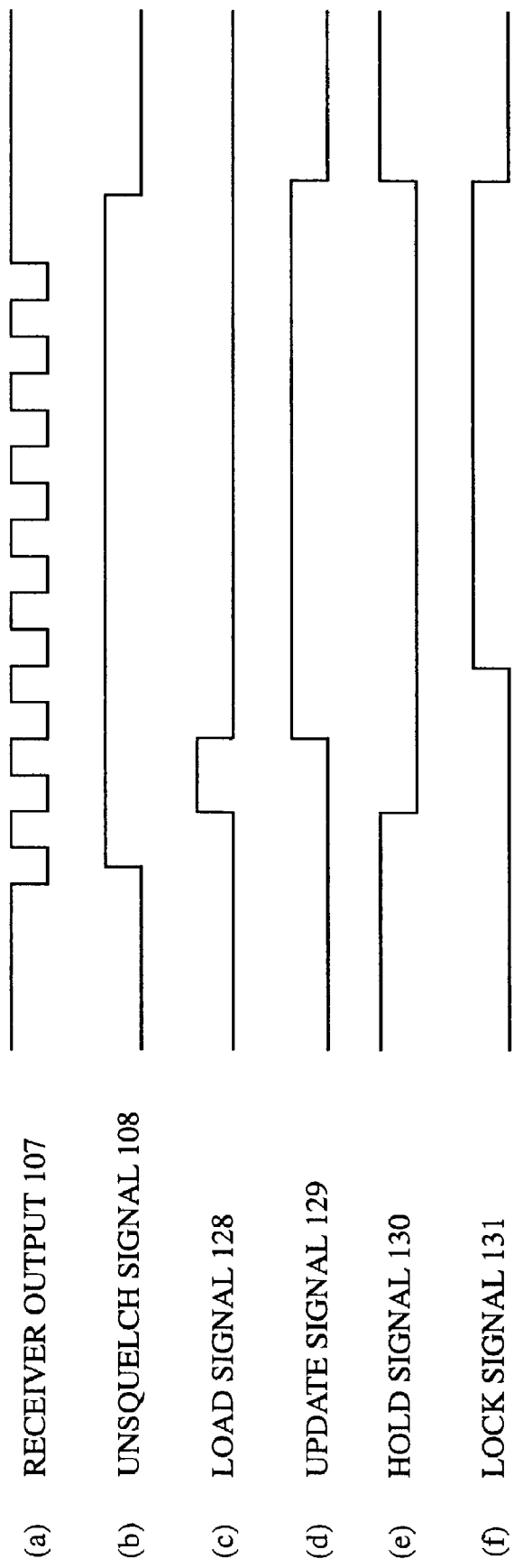
FIG. 18 is a timing chart illustrating the operation of a control circuit 123 of an embodiment 5 in accordance with the present invention.

The control circuit 123 generates from the unsquelch signal 108 and receiver output 107 a signal group consisting of the load signal 128, update signal 129, hold signal 130 and lock signal 131 for controlling the clock selection signal generating circuit 121 and synchronizing circuit 124. The load signal 128, update signal 129 and hold signal 130 each designate the operation mode of the clock selection signal generating circuit 121. Immediately after the unsquelch signal 108 is asserted, that is, immediately after the receiving is started, the control circuit 123 asserts the load signal 128 to synchronize the recovered clock signal 110 with the receiver output 107 at once as illustrated in FIG. 18. Subsequently, the control circuit 123 negates the load signal 128, and asserts the update signal 129. It continues to assert the update signal 129 throughout the time the unsquelch signal 108 is asserted. While the unsquelch signal 108 is negated, the control circuit 123 negates the update signal 129 and load signal 128, and asserts the hold signal 130. The lock signal 131 is a signal indicating that the recovered clock signal 110 is locked in the receiver output 107, and is asserted from the time when the load signal 128 is negated to the time when the unsquelch signal 108 is negated. While it is being asserted, the lock signal 131 indicates that the receiver output 107 can be captured correctly using the recovered clock signal 110.

The synchronizing circuit 124 generates the synchronized data signal 111, synchronized unsquelch signal 112 and synchronized lock signal 113 by synchronizing the receiver output 107, unsquelch signal 108 and lock signal 131 by the recovered clock signal 110.

Next, the positive edge position information 125 and negative edge position information 126 will be described.

Figure 3:
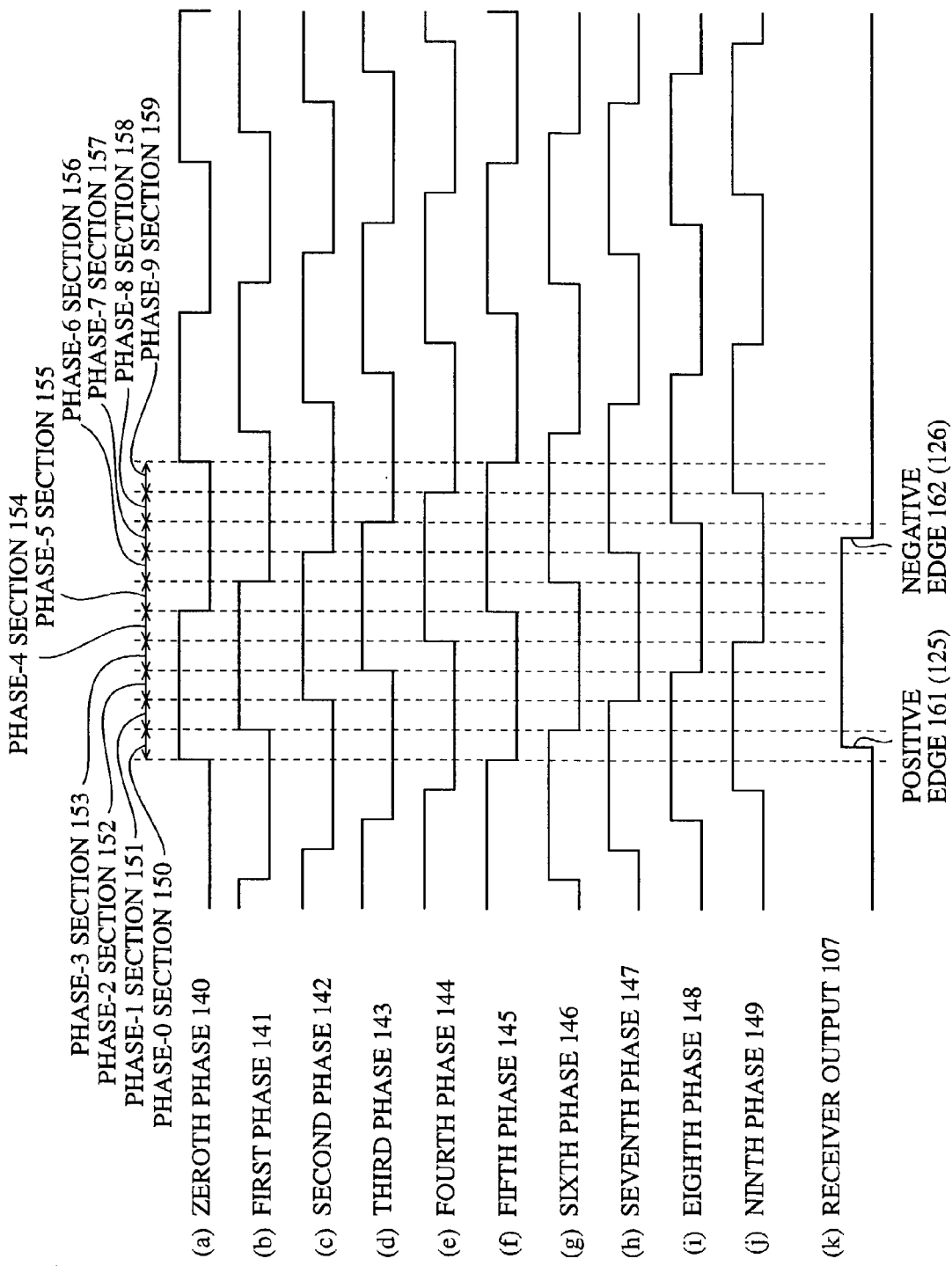
FIG. 3 is a timing chart illustrating phase relationships between a receiver output and 10 clock signals constituting a clock signal group.

FIG. 3 is a timing chart illustrating phase relationships between the receiver output 107 and 10 clock signals constituting the clock signal group. In FIG. 3, the clock signal group 109 consists of 10 clock signals with a frequency 480 MHz and different phases: zeroth phase 140, first phase 141, second phase 142, third phase 143, fourth phase 144, fifth phase 145, sixth phase 146, seventh phase 147, eighth phase 148 and ninth phase 149. The clock signals with the first phase 141 to zeroth phase 140 lag behind the clock signals with the zeroth phase 140 to ninth phase 149 by 36 degrees in their phases, respectively. On the basis of the 10-phase clock signals, one period of 480 MHz is divided into 10 sections, and the phase section between the positive edge of the zeroth phase 140 and the positive edge of the first phase 141 is called a phase-0 section 150. Likewise, the phase section between the positive edges of the first phase 141 and second phase 142, that of the second phase 142 and third phase 143, that of the third phase 143 and fourth phase 144, that of the fourth phase 144 and fifth phase 145, that of the fifth phase 145 and sixth phase 146, that of the sixth phase 146 and seventh phase 147, that of the seventh phase 147 and eighth phase 148, that of the eighth phase 148 and ninth phase 149, and that of the ninth phase 149 and zeroth phase 140 are called phase-1 section 151, phase-2 section 152, phase-3 section 153, phase-4 section 154, phase-5 section 155, phase-6 section 156, phase-7 section 157, phase-8 section 158, phase-9 section 159. In FIG. 3, the positive edge 161 of the receiver output 107 is present in the phase-0 section 150 between the positive edge of the zeroth phase 140 and the positive edge of the first phase 141. In this case, the value of the positive edge position information 125 the edge detector 120 outputs is "0". Likewise, the negative edge 162 of the receiver output 107 is present in the phase-7 section 157, and the value of the negative edge position information 126 becomes "7".

As described above, the present embodiment 1 is a recovery circuit employing a method of selecting the clock signal. Accordingly, it can implement a simple configuration.

In addition, determining the target clock signal using the two pieces of information about the positive edge and negative edge enables the optimum clock signal to be selected as the target clock signal even when the position of the positive edge separates greatly from the position of the negative edge, that is, when the duty ratio is unfavorable.

Furthermore, since the edge detector 120, clock selection signal generating circuit 121 or control circuit 123 does not utilize a high rate PLL clock signal or recovered clock signal 110 as their clock signal, but uses the low rate input data, that is, the receiver output 107, as the clock signal, it becomes easier to configure a high-speed circuit in its entirety. Besides, the present embodiment 1 can implement low power consumption and low EMI (electromagnetic interface).

In addition, the load period provided for the clock selection signal generating circuit 121 enables the clock signal to be synchronized with the data immediately after the start of receiving the input data.

Furthermore, the update period provided for the clock selection signal generating circuit 121 to limit the transition scheme of the clock signal in the update interval makes it possible to prevent the switching period of the clock signal from becoming too short, thereby facilitating the implementation of the circuit using the recovered clock signal 110.

Moreover, the hold mode can increase the noise resistance in the idle mode.

Embodiment 2

Figure 4:
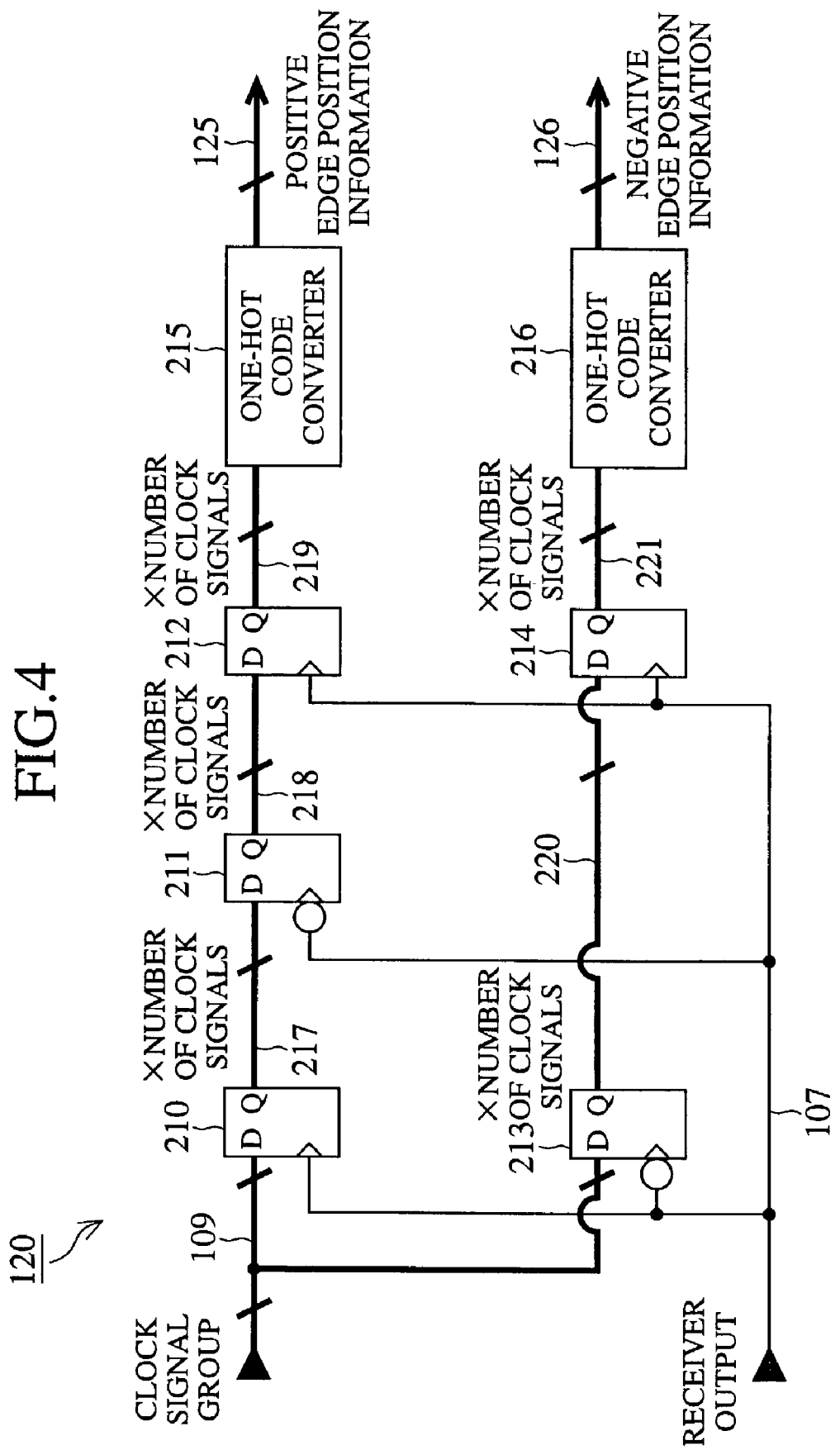
FIG. 4 is a block diagram showing a detailed configuration of an edge detector 120 of an embodiment 2 in accordance with the present invention.

FIG. 4 is a block diagram showing a detailed configuration of the edge detector 120 of an embodiment 2 in accordance with the present invention. In FIG. 4, reference numerals 210–214 each designate a 10-bit flip-flop, and 215 and 216 each designate a one-hot code converter. Incidentally, although the number of bits is expressed as "the number of clock signals" in FIG. 4, the "the number of clock signals" equals the number of taps of the PLL clock signal, which is 10 bits in this case. The output signals of the 10-bit flip-flops 210–214 are called signals 217–221, respectively.

Next, the operation of the present embodiment 2 will be described.

The edge detector 120 samples the clock signals of the clock signal group 109 by the positive edge and negative edge of the receiver output 107, and loads them into the 10-bit flip-flops 210 and 213, respectively. Subsequently, to adjust the timing difference between the signals 217 and 220, the edge detector 120 samples only the signal 217 at the negative edge of the receiver output 107, thereby generating the signal 218. In addition, since the clock signals of the clock signal group 109 are not synchronized with the receiver output 107, a metastable state can occur between the signals 218 and 220. To handle the metastable state, the edge detector 120 samples the signals 218 and 220 by the 10-bit flip-flops 212 and 214 to obtain the signals 219 and 221. Whether the anti-metastable measures are necessary or not depends on the process used. Accordingly, the configurations concerning the 10-bit flip-flops 212 and 214 can differ from the configuration of the present embodiment 2. In other words, the 10-bit flip-flops 212 and 214 may be absent, or synchronized with the negative edge of the receiver output 107. The signals 219 and 221 are values obtained by sampling the individual clock signals of the clock signal group 109 by the positive edge and negative edge of the receiver output 107. They pass through the anti-metastable measures, and their changing timings are synchronized with the positive edge of the receiver output 107. They represent the phase relationships between the positive and negative edges of the receiver output 107 and the clock signals of the clock signal group 109. The bit at which the value of the signal changes from one to zero indicates the number of the phase section.

Figure 5:
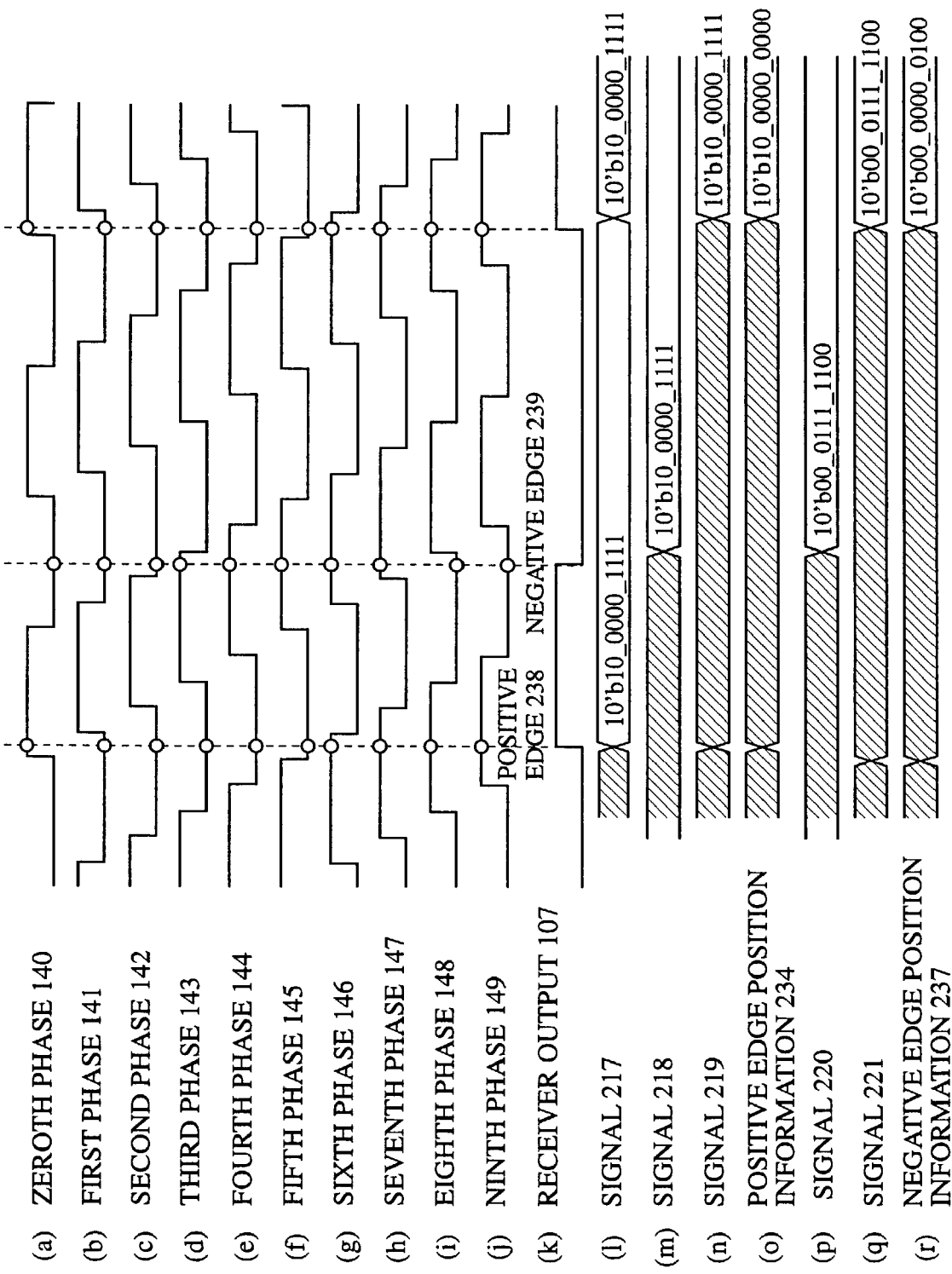
FIG. 5 is a timing chart illustrating the operation of the edge detector.

FIG. 5 is a timing chart illustrating the operation of the edge detector 120. It illustrates waveform examples of the receiver output 107, signals 217–219, positive edge position information 125, signals 220 and 221 and negative edge position information 126.

Since the positive edge 238 of the receiver output 107 is present in the phase-0 section between the positive edge of the zeroth phase 140 and that of the first phase 141, the value of the signal 217 obtained by sampling the clock signals of the clock signal group 109 by the positive edge 238 of the receiver output 107 becomes 10'b 10_0000_1111, where 10'b represents that the data is 10-bit data. The successive 10_0000_1111 represents 10-bit real data. The bit position at which the bit value of the signal 217 changes from one to zero represents the number of phase section "0". Likewise, the phase of the negative edge 239 of the receiver output 107 is present in the phase-7 section, and the value of the signal 220 obtained by sampling the clock signals of the clock signal group 109 by the negative edge 239 becomes 10'b 00_0111_1100. As described above, the two values are subjected to the anti-metastable measures to align their timings. The resultant signals are signals 219 and 221.

The one-hot code converters 215 and 216 convert the signals 219 and 221 indicating the phase section to one-hot code. As for the example of FIG. 5, the phase information "0" of the positive edge is converted to 10'b 10_0000_0000, and the phase information "7" of the negative edge is converted to 10'b 00_0000_0100. Thus, the one-hot code converters 215 and 216 detects the bit switching position.

Figure 6:
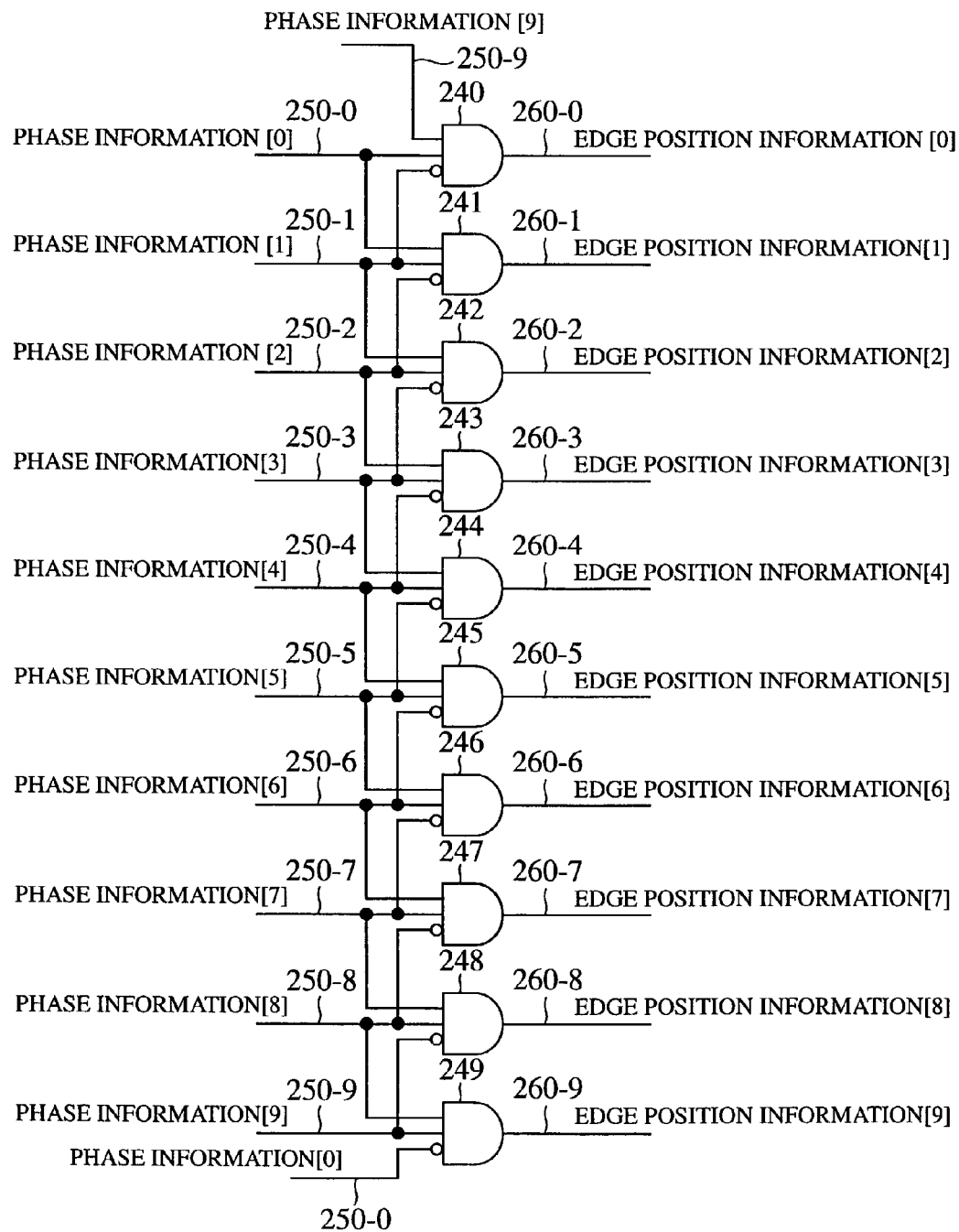
FIG. 6 is a block diagram showing a detailed configuration of a one-hot code converter 215.

FIG. 6 is a block diagram showing a detailed configuration of the one-hot code converter 215 or 216. In FIG. 6, reference numerals 240–249 designate 10 three-input AND circuits. The AND circuits each detect a bit string "110". The conversion into the one-hot code using the 3-bit strings offers an advantage of increasing noise resistance. The reason for this is as follows.

Assume that a one-hot code converter detecting 2-bit strings "10" is used, and that a metastable state occurs which substitutes "1" for "0" and vice versa. In this case, it may detect edge positions at a plurality of phase sections, and hence cannot ensure the one-hot code of the output signal 260. For example, assume that the correct signal 219 "10'b 10_0000_1111" is changed to "10'b 01_0000_1111" because of changes in the zeroth bit from "1" to "0" and in the first bit from "0" to "1". In this case, since the bit string "10" occurs at two positions, the conversion result becomes "10'b 01_0000_0001", which is incorrect as the one-hot code. In contrast with this, the conversion result of the one-hot code converter using the 3-bit string "110" becomes "10'b 00_0000_0001" because there is only one position that matches "110", thereby producing the correct one-hot code.

As described above, the present embodiment 2 employs the 3-bit one-hot code converters 215 and 216, thereby increasing the noise resistance. In other words, it can detect the position as which switching between "0" and "1" occurs more accurately by using three consecutive values than by using two consecutive values. In particular, if the metastable takes place, substitution can sometimes take place at adjacent bits. Hence, using only 2-bit values can cause erroneous detection of the edge.

Furthermore, determining the target clock signal by using the two pieces of information about the positive edge and negative edge enables the optimum clock signal to be detected as the target clock signal even if the position of the positive edge is separated greatly from that of the negative edge, that is, even if the duty ratio is unfavorable.

Embodiment 3

Figure 7:
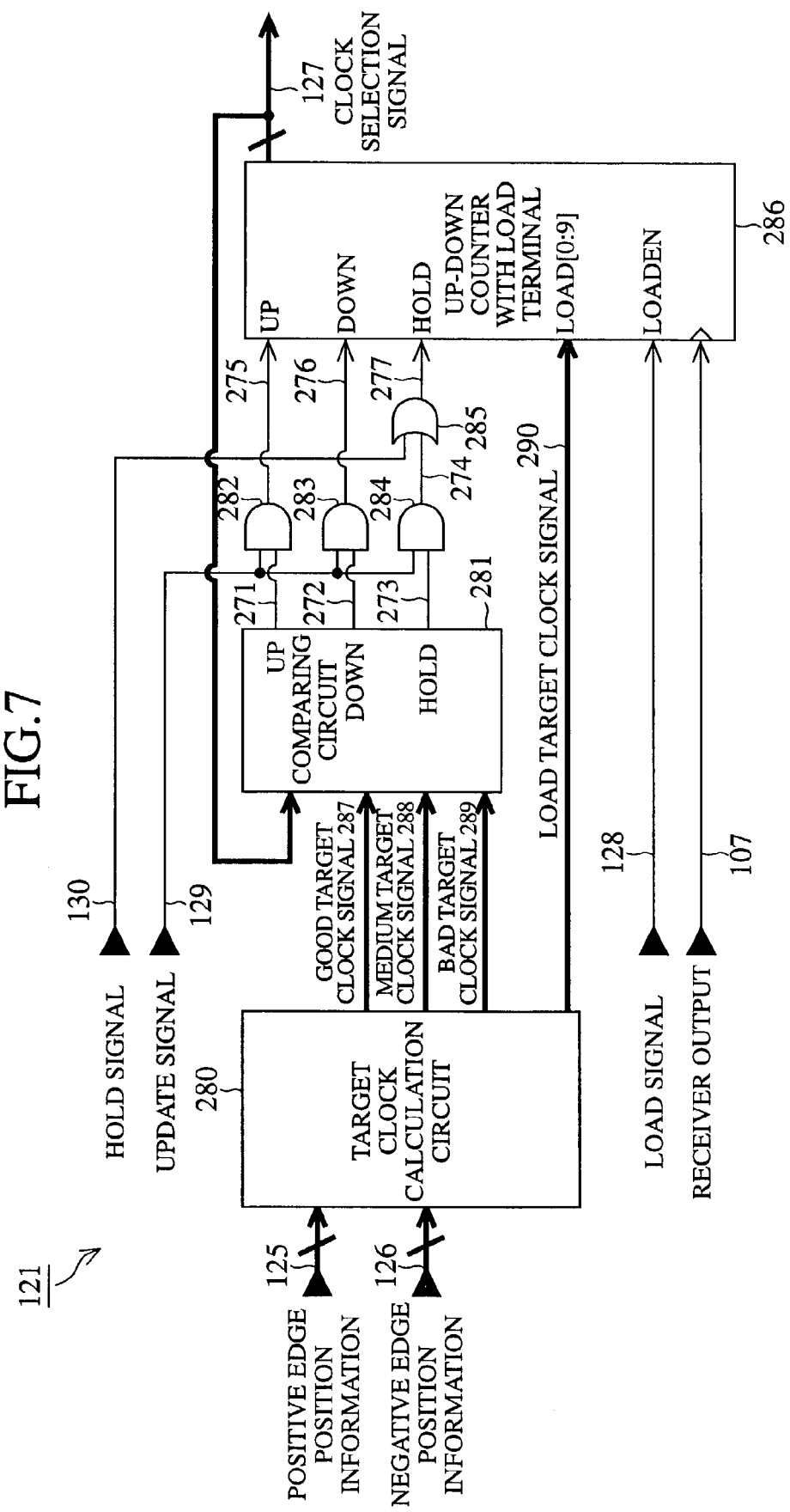
FIG. 7 is a block diagram showing a detailed configuration of a clock selection signal generating circuit 121 of an embodiment 3 in accordance with the present invention.

FIG. 7 is a block diagram showing a detailed configuration of the clock selection signal generating circuit of an embodiment 3 in accordance with the present invention. In FIG. 7, the reference numeral 280 designates a target-clock calculation circuit, 281 designates a comparing circuit, reference numerals 282–284 each designate an AND circuit, the reference numeral 285 designates an OR circuit and 286 designates an up-down counter with a load terminal.

Next, the operation of the present embodiment 3 will be described.

The target-clock calculation circuit 280 is a combination circuit for generating, from the positive edge position information 125 and negative edge position information 126, four sets of 10-bit signals, a good target clock signal 287, a medium target clock signal 288, a bad target clock signal 289 and a load target clock signal 290. The load target clock signal 290 is the target clock signal for loading, which selects one of the clock signals with a phase most distant from the positive edge and negative edge. The bad target clock signal 289 is a signal that is asserted only when the phase of the positive edge position information 125 is most distant from that of the negative edge position information 126, that is, the phase difference is five. When asserted, the bad target clock signal 289 selects two clock signals most distant from the positive edge or negative edge. The medium target clock signal 288 is a signal that is asserted when the phase difference between the positive edge and negative edge is 3, 4, 6 and 7. When asserted, the medium target clock signal 288 selects one clock signal whose phase is most distant from the positive edge or negative edge. The good target clock signal 287 is asserted only when the phase of the positive edge is close to that of the negative edge, that is, only when the phase difference between them is 0, 1, 2, 8 and 9. When asserted, the good target clock signal 289 selects one of the clock signals whose phase is most distant from the positive edge or negative edge.

While the load signal 128 is asserted, the load target clock signal 290 is loaded into the up-down counter 286 with the load terminal as its value. This means that the value of the next clock selection signal 127 becomes equal to the value of the load target clock signal 290.

The comparing circuit 281 compares the three target clock signals (good target clock signal 287, medium target clock signal 288 and bad target clock signal 289) with the current value of the clock selection signal 127. When the value of the clock selection signal 127 approaches any one of the target clock signals by incrementing the clock selection signal 127, the comparing circuit 281 asserts the UP operation signal 271. When the value of the clock selection signal 127 approaches any one of the target clock signals by decrementing the clock selection signal 127, the comparing circuit 281 asserts the DOWN operation signal 272. When it is not necessary to change the clock selection signal 127 because the clock selection signal 127 is close to the three target clock signals, the comparing circuit 281 asserts the HOLD operation signal 273.

While the update signal 129 fed from the outside is being asserted, the up-down counter 286 with the LOAD terminal determines the next value from the values of the UP operation signal 271, DOWN operation signal 272 and HOLD operation signal 273 through the AND circuits 282–284.

While the hold signal 130 from the outside is being asserted, the up-down counter 286 with the LOAD terminal always holds the previous value through the OR circuit 285.

Figure 8:
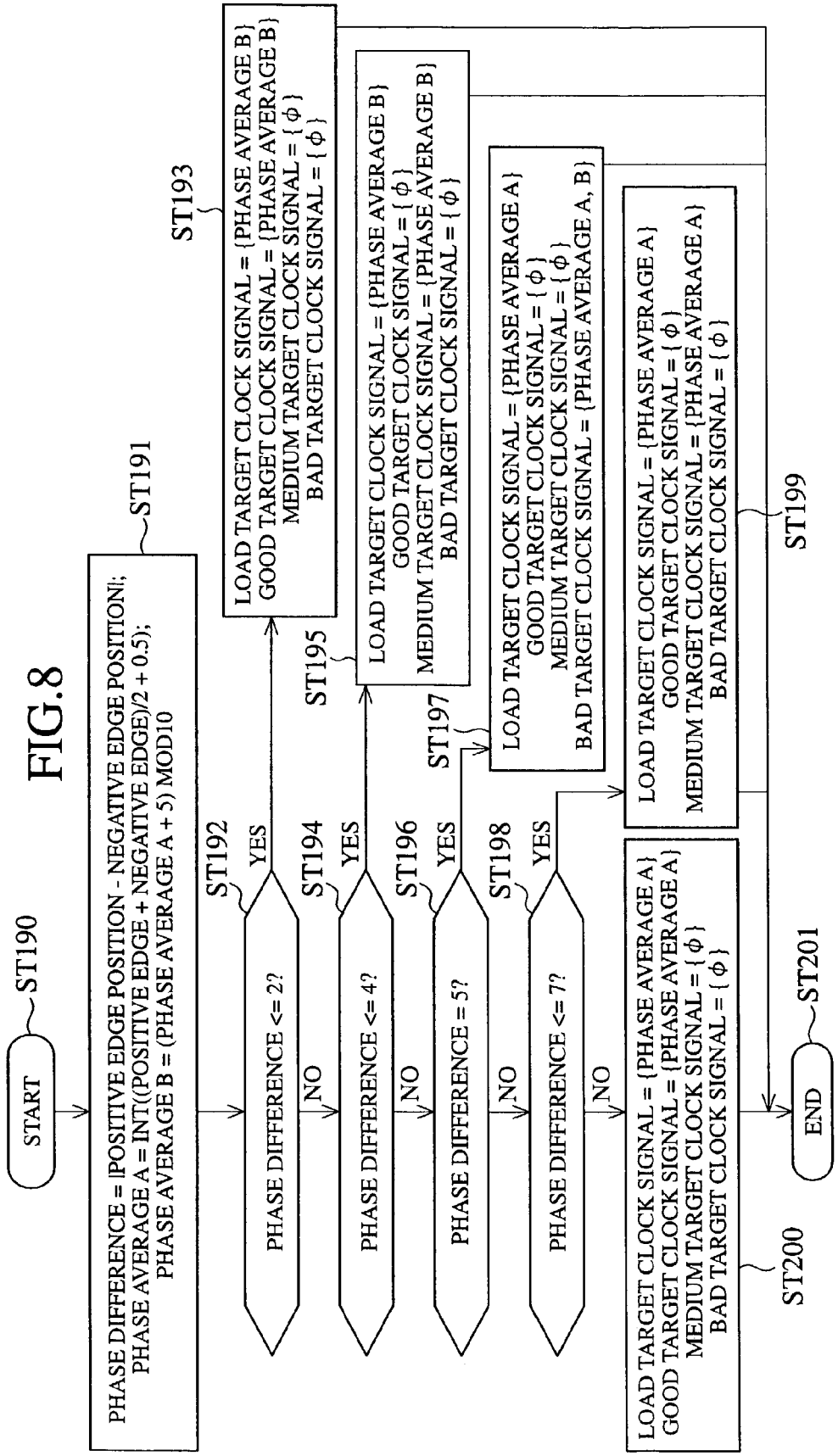
FIG. 8 is a flowchart illustrating a calculation example of a target-clock calculation circuit 280.

FIG. 8 is a flowchart illustrating a calculation example of the target-clock calculation circuit 280.

First, the target-clock calculation circuit 280 calculates the following values: phase difference equal to the absolute value of the difference between the positive edge position information 125 and negative edge position information 126; phase average A; and phase (phase average B) that differs 180 degrees from the phase average A (step ST191). The phase average A is obtained by adding 0.5 to the average value of the positive edge position and negative edge position and by dropping the fractional portion of the number to the nearest integer. The phase average B is calculated using modulo-10 summing five, half the number of clock signals, with the phase average A, thereby obtaining the phase with 180-degree phase difference. Subsequently, the target-clock calculation circuit 280 calculates the target clock signal for each phase difference. When the phase difference is less than five, the phase average B is the phase most distant from the positive edge position or negative edge position. Thus, when the phase difference is equal to or less than two (step ST192), the phase average B is substituted for the load target clock signal and good target clock signal, and the values of the remaining target clock signals are made empty set (step ST193). When the phase difference is equal to or greater than three and less than five (step ST194), the phase average B is substituted for the load target clock signal and medium target clock signal, and the values of the remaining target clock signals are made empty set (step ST195). When the phase difference is five (step ST196), both the phase average A and phase average B are the phase most distant from the positive edge position or negative edge position. In this case, the value of the load target clock signal is made phase average A, and the value of the bad target clock signal becomes the set consisting of the phase average A and phase average B, and the values of the remaining target clock signals are made empty set (step ST197). When the phase difference is equal to or greater than six, the phase average A is the most distant phase from the positive edge position or negative edge position. Thus, when the phase difference is equal to or greater than six and equal to or less than seven (step ST198), the phase average A is substituted for the load target clock signal and medium target clock signal, and the values of the remaining target clock signals are made empty set (step ST199). When the phase difference is equal to or greater than eight (step ST198), the phase average A is substituted for the load target clock signal and good target clock signal, and the values of the remaining target clock signals are made empty set (step ST200).

For example, when the value of the positive edge position information 125 is "0", and the value of the negative edge position information 126 is "7", the phase difference is given as follows:

phase difference=|"0"−"7"|=7

The phase average A and phase average B are calculated as follows:

phase average $A=int(("0"-"7")/2+0.5)=int(4)=4$ phase average $B=(4+5)$ MOD $10=9$ Since the phase difference is "7", the values of the target clock signals are obtained as follows according to step ST199.

load target clock signal={7},
good target clock signal={Φ},
medium target clock signal={7}, and
bad target clock signal={Φ}

Figure 9:
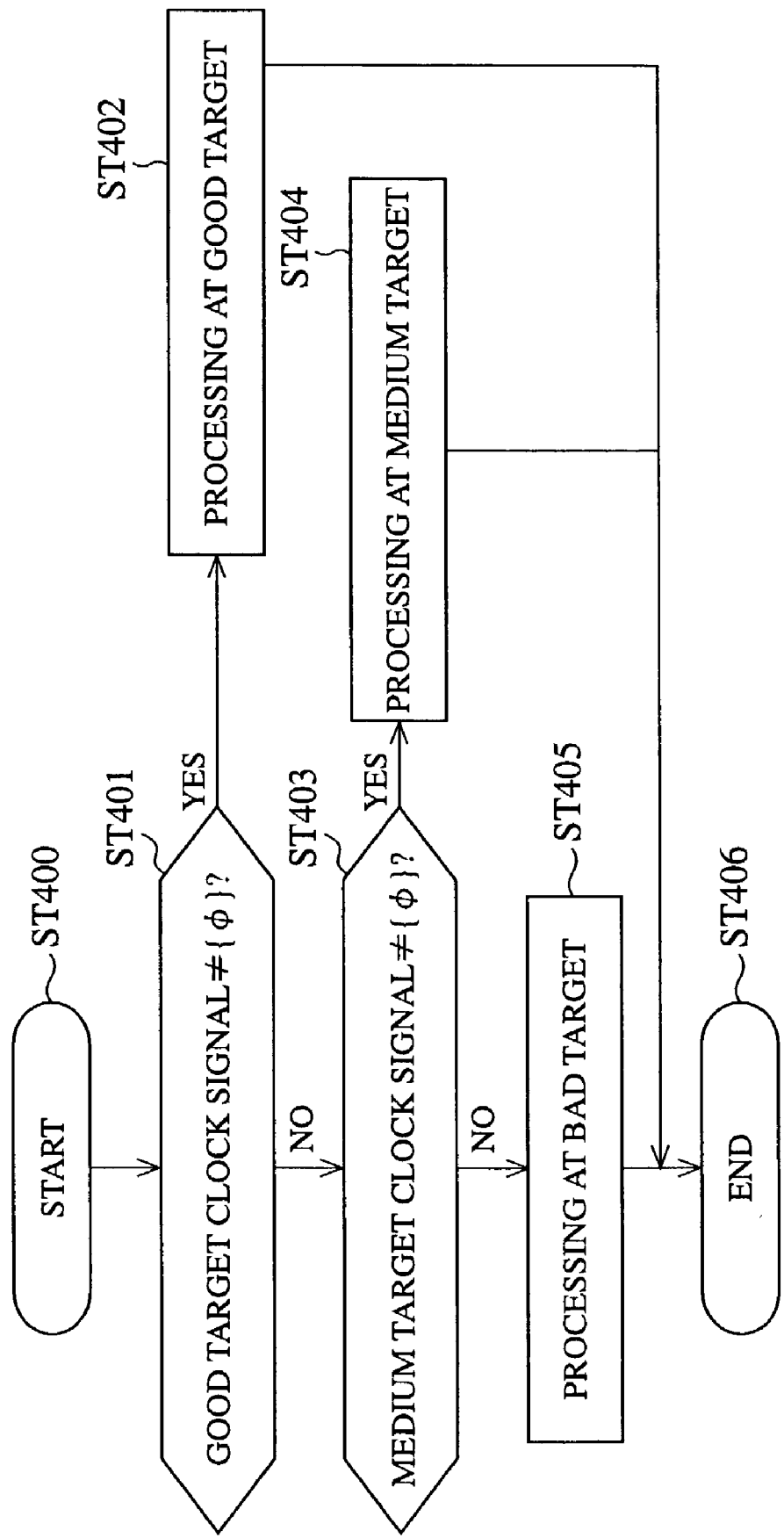
FIG. 9 is a flowchart illustrating the operation of a comparing circuit 281.

FIG. 9 is a flowchart illustrating the operation of the comparing circuit 281.

The comparing circuit 281 carries out its comparison in a different manner according to the types of the target clock signals. First, when the good target clock signal is not the empty set (step ST401), the comparing circuit 281 performs comparing operation in the good target mode (step ST402). Likewise, when the medium target clock signal is not the empty set (step ST403), the comparing circuit 281 performs the comparing operation in the medium target mode (step ST404). When both the good target clock signal and the medium target clock signal are the empty set, the comparing circuit 281 carries out the comparing operation in the bad target mode (step ST405).

Figure 10:
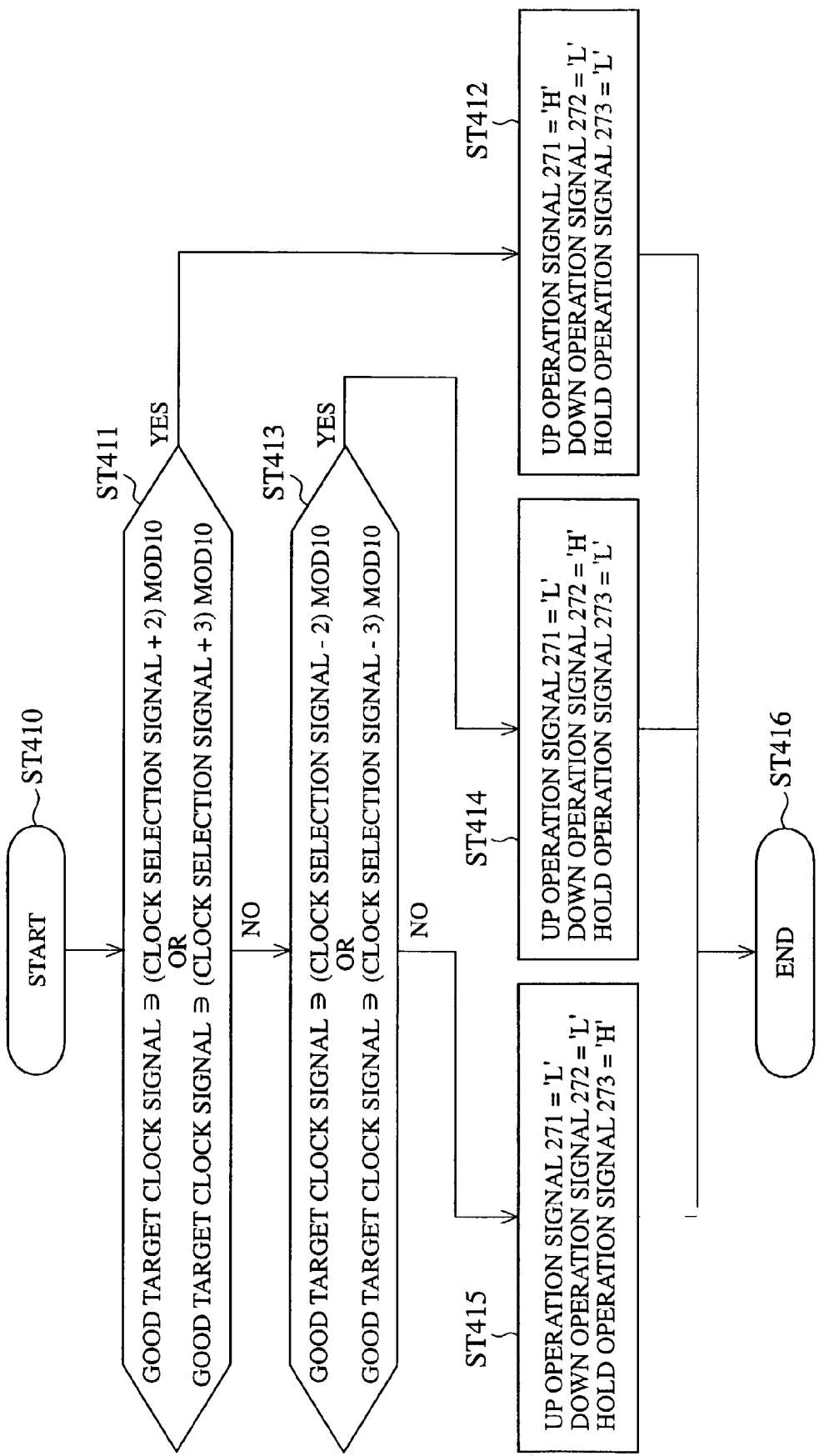
FIG. 10 is a flowchart illustrating the operation of the comparing circuit 281 at good target processing.

FIG. 10 is a flowchart illustrating the comparing operation in the good target mode. When the good target clock signal includes the phase number greater than the current clock selection signal 127 by two or three (step ST411), the comparing circuit 281 asserts only the UP operation signal 271 (step ST412). When the good target clock signal includes the phase number less than the current clock selection signal 127 by two or three (step ST413), the comparing circuit 281 asserts only the DOWN operation signal 272 (step ST414) In the remaining cases, the comparing circuit 281 asserts only the HOLD operation signal 273 (step ST415).

Figure 11:
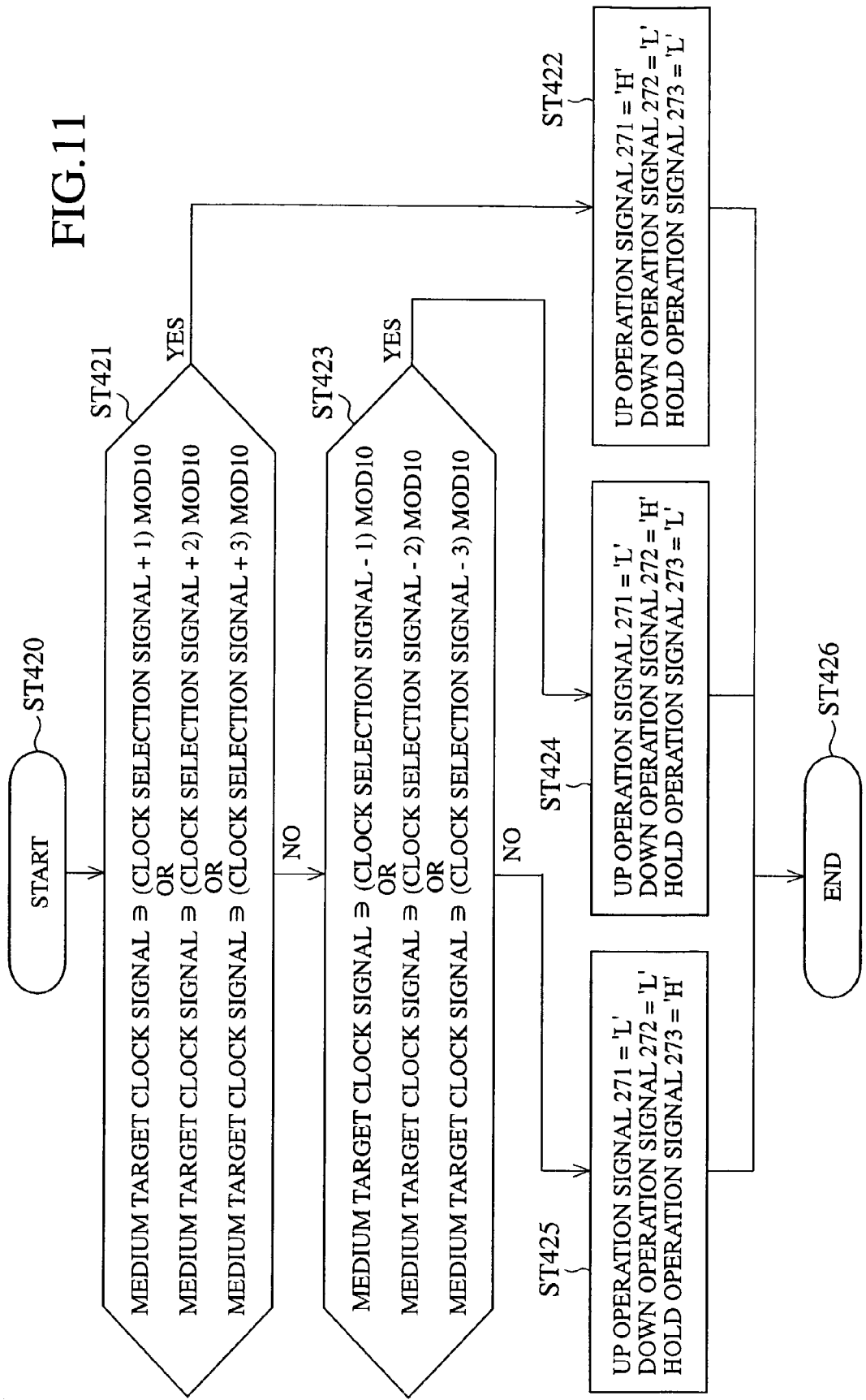
FIG. 11 is a flowchart illustrating the operation of the comparing circuit 281 at medium target processing.

FIG. 11 is a flowchart illustrating the comparing operation in the medium target mode. When the medium target clock signal includes the phase number greater than the current clock selection signal 127 by one, two or three (step ST421), the comparing circuit 281 asserts only the UP operation signal 271 (step ST422). When the medium target clock signal includes the phase number less than the current clock selection signal 127 by one, two or three (step ST423), the comparing circuit 281 asserts only the DOWN operation signal 272 (step ST424). In the remaining cases, the comparing circuit 281 asserts only the HOLD operation signal 273 (step ST425).

Figure 12:
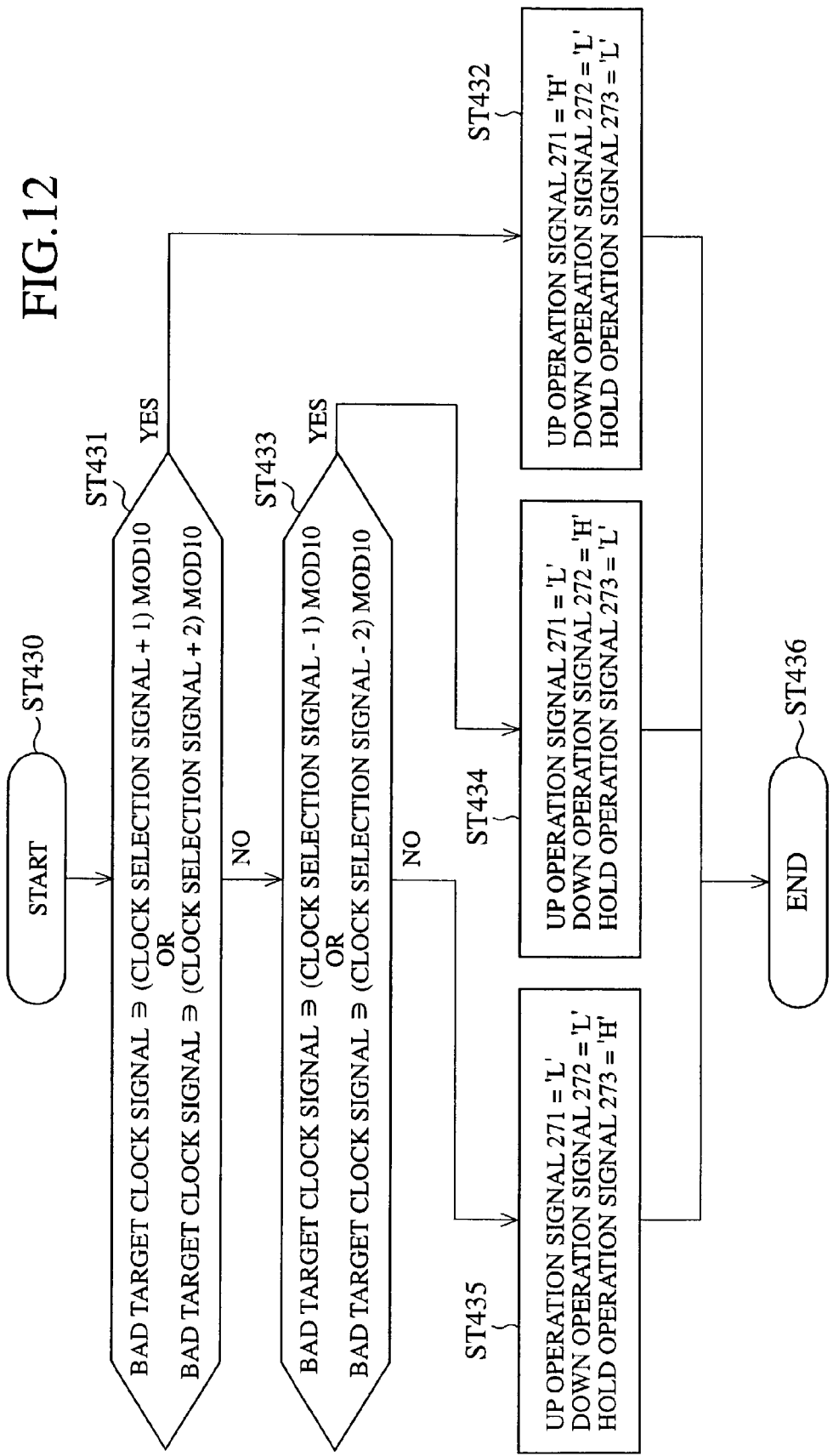
FIG. 12 is a flowchart illustrating the operation of the comparing circuit 281 at bad target processing.

FIG. 12 is a flowchart illustrating the comparing operation in the bad target mode. When the bad target clock signal includes the phase number greater than the current clock selection signal 127 by one or two (step ST431), the comparing circuit 281 asserts only the UP operation signal 271 (step ST412). When the bad target clock signal includes the phase number less than the current clock selection signal 127 by one or two (step ST433), the comparing circuit 281 asserts only the DOWN operation signal 272 (step ST434). In the remaining cases, the comparing circuit 281 asserts only the HOLD operation signal 273 (step ST435).

As described above, the present embodiment 3 can obtain the target clock signal with high accuracy by calculating the target clock signal considering the phase difference.

In addition, since the comparing circuit 281 generates the clock selection signal 127 considering the phase difference, it can select the clock signal flexibly considering the phase difference between the current clock selection signal and data. More specifically, the present embodiment 3 is configured such that it generates the clock selection signal 127 in response to the positive edge position information 125 and negative edge position information 126 in such a manner that when the phase difference between the positive edge and negative edge is large, the clock signal is varied frequently, whereas when the phase difference is small, the clock signal is varied less frequently. Thus, the present embodiment 3 can prevent the locked state from being lost in the communication environment with great jitter, thereby being able to recover the clock signal and data with high accuracy.

Embodiment 4

Figure 13:
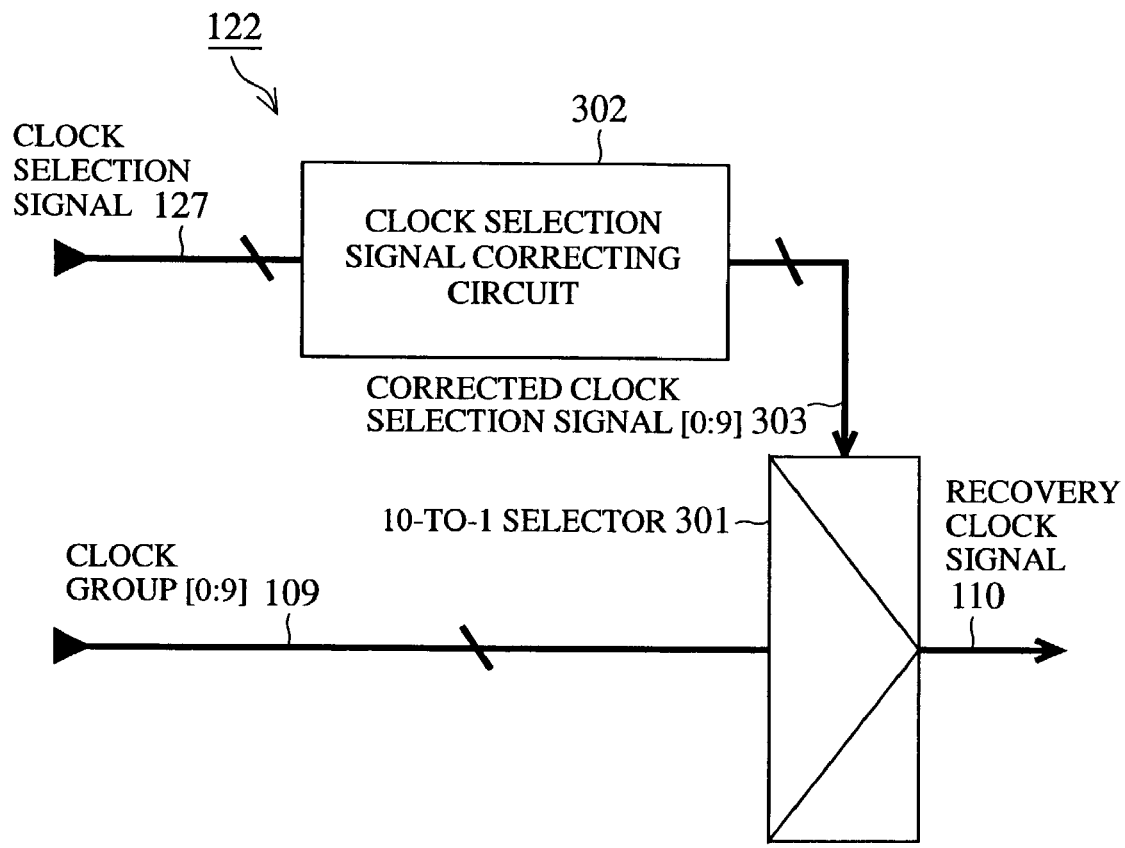
FIG. 13 is a block diagram showing a detailed configuration of a clock selection circuit 122 of an embodiment 4 in accordance with the present invention.

FIG. 13 is a block diagram showing a detailed configuration of the clock selection circuit 122 of an embodiment 4 in accordance with the present invention. In FIG. 13, the reference numeral 301 designates a 10-to-1 selector, and 302 designates a clock selection signal correcting circuit.

The clock selection signal correcting circuit 302 corrects the timing of the clock selection signal 127 to prevent a spike from occurring in the recovered clock signal 110 during the UP or DOWN operation of the clock selection signal 127. The clock selection signal 127 after undergoing the correction is referred to as a corrected clock selection signal 303. The 10-to-1 selector 301 selects the clock signal designated by the corrected clock selection signal 303 from the clock signal group 109, and outputs it as the recovered clock signal 110.

Figure 14:
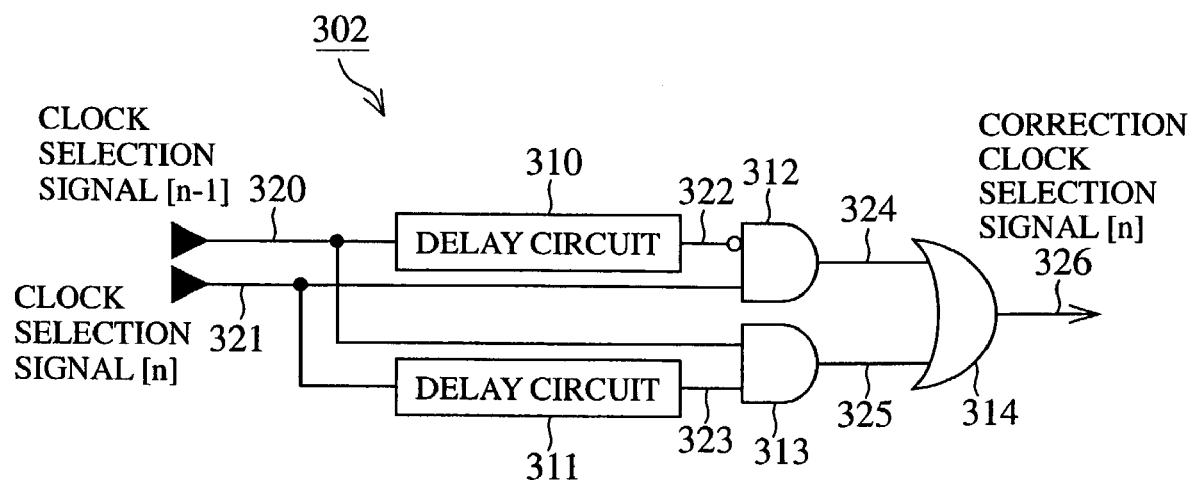
FIG. 14 is a block diagram showing a detailed configuration of a clock selection signal correcting circuit 302.

FIG. 14 is a block diagram showing a detailed configuration of the clock selection signal correcting circuit 302, which represents only nth bit of the 10-bit corrected clock selection signal. Thus, the clock selection signal correcting circuit includes 10 such circuits. In FIG. 14, reference numerals 310 and 311 each designate a delay circuit, 312 and 313 each designate an AND circuit, and the reference numeral 314 designates an OR circuit.

Figure 15:
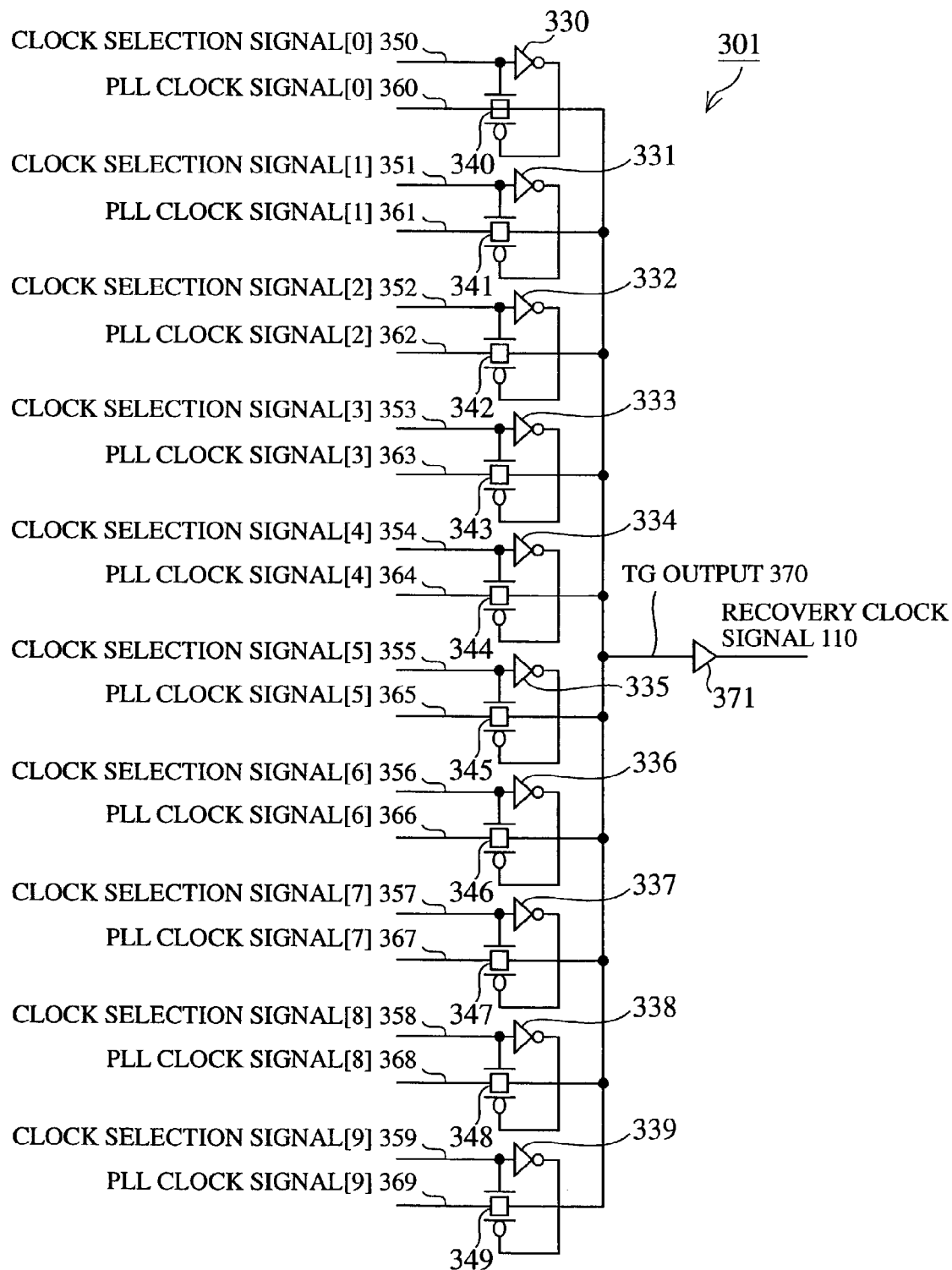
FIG. 15 is a block diagram showing a detailed configuration of a 10-to-1 selector 301.

FIG. 15 is a circuit diagram showing a detailed configuration of the 10-to-1 selector 301. In FIG. 15, reference numerals 330–339 each designate an inverter, 340–349 each designate a transmission gate (TG), and the reference numeral 371 designates a buffer.

Next, the operation of the present embodiment 4 will be described.

Figure 16:
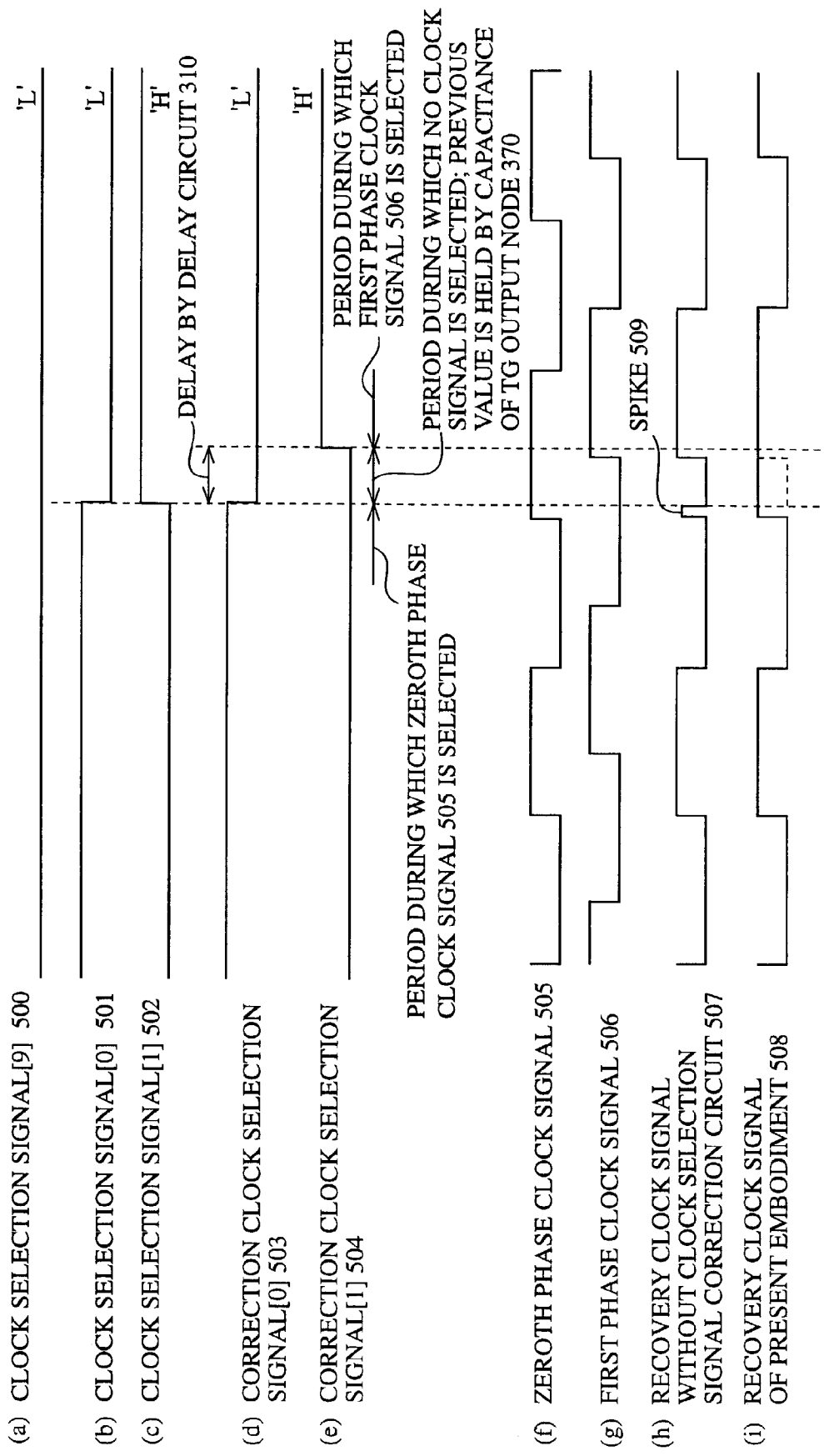
FIG. 16 is a timing chart illustrating the operation of the clock selection circuit 122 at UP operation.

FIG. 16 is a timing chart illustrating the operation of the clock selection circuit 122 during the UP operation. FIG. 16 illustrates the timing of the UP operation when the clock selection signal 127 is switched from "0" to "1". The clock selection signal [0] 501 indicates that the zeroth phase clock signal 505 is being selected. In other words, during the assertion of this signal, the zeroth phase clock signal 505 is output as the recovered clock signal 110. Likewise, the clock selection signal [1] 502 and clock selection signal [9] 500 indicates that the first phase clock signal 506 and ninth phase clock signal are selected. For the purpose of comparison, the recovered clock signal 507 is illustrated which appears when the clock selection signal 127 is immediately applied to the 10-to-1 selector 301 without passing through the clock selection signal correcting circuit 302. A spike 509 (FIG. 16(h)) occurs in the recovered clock signal 507 when the switching timing of the clock selection signal is close to the changing timing of the phase clock signal. More specifically, when the zeroth phase clock signal 505 is asserted immediately before the negation of the clock selection signal [0] 501, and the recovered clock signal 507 is asserted from "L" to "H", followed by asserting the clock selection signal [1] 502 immediately thereafter, the recovered clock signal 507 is negated to "L". In this way, the recovered clock signal 507 changes such as "L"→"H"→"L" in a short period, thereby bringing about the spike 509. The clock selection signal correcting circuit 302 of the present embodiment 4 is devised to eliminate the spike 509.

The corrected clock selection signal [0] 503 and corrected clock selection signal [1] 504 are signals obtained by correcting the timing of the clock selection signal [0] 501 and clock selection signal [1] 502 by the clock selection signal correcting circuit 302. The rising edge of the corrected clock selection signal [1] 504 retards by an amount of the delay of the delay circuit 310. As a result, from the falling edge of the corrected clock selection signal [0] 503 to the rising edge of the corrected clock selection signal [1] 504, there emerges a period in which no clock signal is selected, which makes it possible to suppress the spike 509. The recovered clock signal 508 is a result when the corrected clock selection signal [0] 503 and corrected clock selection signal [1] 504 select the zeroth phase clock signal 505 and first phase clock signal 506 successively. Although the value of the clock signal immediately after the switching of the clock signal is variable, since the period in which no clock signal is selected is inserted immediately after the switching, the value of the recovered clock signal is held by the capacitance at the output of the TG of FIG. 15. Thus, the spike 509 which appears in the recovered clock signal 507 does not occur in the recovered signal 508.

Figure 17:
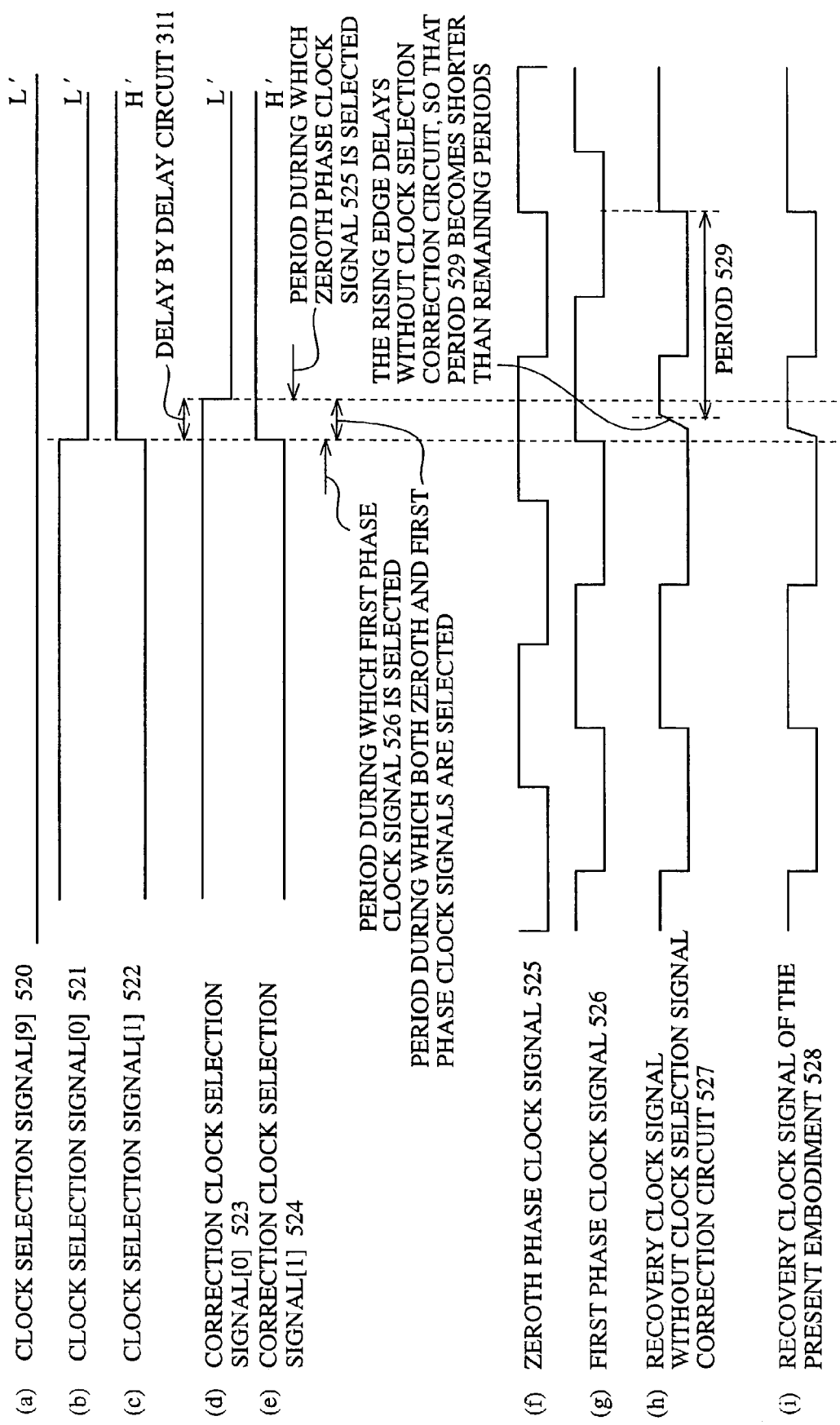
FIG. 17 is a timing chart illustrating the operation of the clock selection circuit 122 at DOWN operation.

FIG. 17 is a timing chart illustrating the operation of the clock selection circuit 122 during the DOWN operation. FIG. 17 illustrates the timing of the DOWN operation when the clock selection signal 127 is switched from "1" to "0". As in FIG. 16, the clock selection signal [0] 521 indicates that the zeroth phase clock signal 525 is being selected. In other words, during the assertion of this signal, the zeroth phase clock signal 525 is output as the recovered clock signal 110. Likewise, the clock selection signal [1] 522 and clock selection signal [9] 520 indicates that the first phase clock signal 526 and ninth phase clock signal are selected. For the purpose of comparison, the recovered clock signal 527 is illustrated which appears when the clock selection signal 127 is immediately applied to the 10-to-1 selector 301 without passing through the clock selection signal correcting circuit 302. When the clock selection signal 127 is switched immediately before the first phase clock signal 526 is asserted, the rising edge of the recovered clock signal 527 immediately after the switching retards, reducing the period 529 (FIG. 17(h)) as compared with other periods. The clock selection signal correcting circuit 302 of the present embodiment 4 is devised to prevent the reduction of the period.

The corrected clock selection signal [0] 523 and corrected clock selection signal [1] 524 are signals obtained by correcting the timing of the clock selection signal [0] 521 and clock selection signal [1] 522 by the clock selection signal correcting circuit 302. The falling edge of the corrected clock selection signal [1] 524 retards by an amount of the delay of the delay circuit 311. As a result, from the rising edge of the corrected clock selection signal [0] 523 to the falling edge of the corrected clock selection signal [1] 524, there emerges a period in which the two clock signals are selected. Since the two clock signals drive the TG output 370 of FIG. 15 while they are selected, the rising edge of the recovered clock signal 528 immediately after the switching is improved, thereby suppressing the reduction in the period to a minimum.

As described above, the present embodiment 4 can prevent the spike from appearing in the recovered clock signal regardless of the switching timing of the selection clock signal.

In addition, it can suppress the fluctuations in the period to a minimum regardless of the timing of switching the selection clock signal.

Embodiment 5

FIG. 18 is a timing chart illustrating the operation of the control circuit 123 of an embodiment 5 in accordance with the present invention. The control circuit 123 (FIG. 2) utilizes the receiver output 107 as the clock signal. Immediately after the unsquelch signal 108 is asserted, that is, immediately after the receiver output 107 becomes effective, the load signal 128 is asserted for only one period. Subsequently, until the unsquelch signal 108 is negated, the update signal 129 is asserted. During the interval in which both the load signal 128 and update signal 129 are negated, the hold signal 130 is asserted. The lock signal 131 is asserted at the timing at which the result of asserting the load signal 128 is reflected in the recovered clock signal 110. The period during which the load signal 128 is asserted is defined as a load period, the period during which the update signal 129 is asserted as an update period, and the period during which the hold signal 130 is asserted as a hold period.

As described above, the present embodiment 5 is configured such that the clock selection signal generating circuit 121 has the load period apart from the update period. Thus, the present embodiment 5 can synchronize the clock signal to the data immediately after the start of receiving the input data.

In addition, it is possible to prevent the occurrence of the spike and reduction in the period at the clock signal switching by providing the clock selection signal generating circuit 121 with the update period apart from the load period, and by limiting the transition of the clock signal during the update period to the three modes, one increment, one decrement and hold.

Furthermore, the adverse effect of external noise can be prevented by providing the hold period, and by suppressing the changes of the clock signal during the hold period.

Embodiment 6

FIG. 19 is a block diagram showing a detailed configuration of the synchronizing circuit 124 of an embodiment 6 in accordance with the present invention. In FIG. 19, reference numerals 560 and 569 each designate a delay circuit, 561–568 each designate a flip-flop, and 570 and 571 each designate an AND circuit.

The delay amount of the delay circuits 560 and 569 is equal to the total delay from the clock signal group 109 to the recovered clock signal 110 of FIGS. 1 and 2. The receiver output 580 passing through the delay circuit 560 is sampled by the recovered clock signal 110. The AND circuit 570 cancels out the data before locking the clock signal. The output of the AND circuit 570 is passed through the two flip-flops 562 and 563 to obtain the synchronized data signal 111. The synchronized unsquelch signal 112 is obtained in the same manner. On the other hand, the synchronized lock signal 113 is obtained by passing the lock signal 131 through the flip-flops 567 and 568, the clock signal of which is the recovered clock signal 110.

Here, the flip-flops 563, 566 and 588 are added as the anti-metastable measures. Accordingly, the need for the anti-metastable measures and their configuration depend on the process for producing the circuit. Thus, the circuit may not include the flip-flops 563, 566 and 568. Although the AND circuits 570 and 571 are inserted immediately before the flip-flops 562 and 565 in the present embodiment 6, they can be interposed immediately before the flip-flops 561 and 564.

What is claimed is:

1. A data/clock recovery circuit comprising:

an edge detector for generating edge position information by using a receiver output as a clock signal, and by comparing phases of a plurality of clock signals constituting a clock signal group with a phase of an edge of the receiver output;

a clock selection signal generating circuit for generating, using the receiver output as a clock signal, a clock selection signal in response to the edge position information generated by said edge detector, the clock selection signal causing an optimum clock signal for synchronizing the receiver output to be selected from the clock signal group, said clock selection signal generating circuit generates the clock selection signal in response to the positive edge position information and the negative edge position information;

a clock selection circuit for selecting a clock signal from the clock signal group in response to the clock selection signal generated by said clock selection signal generating circuit, and for outputting a selected clock signal as a recovered clock signal; and a synchronizing circuit for synchronizing the receiver output using the recovered clock signal output from said clock selection circuit, and for outputting the synchronized receiver output as a synchronized data signal, wherein said clock selection signal generating circuit comprises means for generating the clock selection signal in response to the positive edge position information and the negative edge position information such that an update frequency of the clock signal is high when a phase difference between the positive edge and the negative edge is large, and is low when the phase difference is small.

2. The data/clock recovery circuit according to claim 1, wherein said edge detector compares the phases of the plurality of clock signals constituting the clock signal group with a phase of a positive edge and a phase of a negative edge of the receiver output, and generates positive edge position information and negative edge position information.

3. The data/clock recovery circuit according to claim 2, further comprising a control circuit for generating mode signals including a load signal, an update signal and a hold signal in response to an unsquelch signal and the receiver output, wherein said clock selection signal generating circuit comprises:

means for calculating a target clock signal in response to the positive edge position information and the negative edge position information when said control circuit generates the load signal, and for generating the target clock signal as the clock selection signal;

means for calculating a next clock selection signal in accordance with a value of a current clock selection signal and a value of a target clock signal when said control circuit generates an update signal; and means for generating a next clock selection signal with a value equal to a value of the current clock selection signal when said control circuit generates the hold signal.

4. The data/clock recovery circuit according to claim 1, wherein said clock selection circuit comprises a clock selection signal correcting circuit for correcting timing of the clock selection signal, and means for selecting the clock signal in response to the corrected clock selection signal.

5. The data/clock recovery circuit according to claim 1, wherein said edge detector comprises a one-hot code converter for converting at least one of the positive edge position information and negative edge position information into a one-hot code by using 3-bit strings of phase information that represents phase relationships between at least one of the positive edge and negative edge of the receiver output with the plurality of clock signals constituting the clock signal group.

* * * * *